United States Patent [19]
Tegude

[11] Patent Number: 5,075,239
[45] Date of Patent: Dec. 24, 1991

[54] METHOD OF MAKING MONOLITHIC INTEGRATED OPTOELECTRONIC MODULES

[75] Inventor: Franz-Josef Tegude, Korntal, Fed. Rep. of Germany

[73] Assignee: Alcatel N.V., Amsterdam, Netherlands

[21] Appl. No.: 487,298

[22] Filed: Mar. 2, 1990

[30] Foreign Application Priority Data

Mar. 30, 1989 [DE] Fed. Rep. of Germany ....... 3910288

[51] Int. Cl.$^5$ ............................................ H01L 21/70
[52] U.S. Cl. ......................................... 437/5; 357/41; 437/31; 437/59; 437/90; 437/129
[58] Field of Search ...................... 148/DIG. 8, 11, 25, 148/26, 59, 56, 53, 65, 72, 95, 110, 119, 135, 169; 156/610–614; 427/248.1, 255.1; 357/16, 17, 15, 19, 29, 30, 34, 41, 43, 22 A; 437/3–5, 31, 39, 51, 54, 59, 81, 89, 90, 108, 111, 126, 129, 133, 912

[56] References Cited

U.S. PATENT DOCUMENTS

| | | | |
|---|---|---|---|
| 4,523,212 | 6/1985 | Hawrylo | 357/17 |
| 4,566,171 | 1/1986 | Nelson et al. | 437/129 |
| 4,774,205 | 9/1988 | Choi et al. | 437/59 |
| 4,891,093 | 1/1990 | Smith | 437/129 |
| 4,940,672 | 7/1990 | Zavracky | 437/129 |

FOREIGN PATENT DOCUMENTS

| | | | |
|---|---|---|---|
| 0061938 | 3/1982 | European Pat. Off. | |
| 0188080 | 7/1986 | European Pat. Off. | |
| 0149076 | 4/1974 | Japan | 437/129 |
| 0044769 | 3/1983 | Japan | 437/129 |
| 0086789 | 5/1983 | Japan | 437/129 |
| 0299375 | 12/1988 | Japan | 437/129 |

OTHER PUBLICATIONS

Ferry, *Gallium Arsenide Technology*, Howard W. Sanas Inc., Indianapolis, Ind., U.S.A., 1985, pp. 382–384.

*Primary Examiner*—Olik Chaudhuri
*Assistant Examiner*—William Bunch
*Attorney, Agent, or Firm*—Spencer & Frank

[57] ABSTRACT

A method of making monolithic integrated optoelectronic modules in which passivation and electric isolation of the individual components are achieved with an epitaxially deposited, semi-insulating (SI) indium phosphide layer. Instead of a semi-insulating substrate, a conducting substrate can therefore be used, which results in a better lattice structure of the deposited layers.

16 Claims, 3 Drawing Sheets

METHOD OF MAKING MONOLITHIC INTEGRATED OPTOELECTRONIC MODULES

BACKGROUND OF THE INVENTION

1. Field of the Invention

The present invention relates to a method of making integrated optoelectronic modules, particularly modules based on III/V compound semiconductors.

2. Discussion of the Background

Optical communication permits very high data transfer rates on the order of 10 to 20 gigabits/second. Data transfer rates of this order place exacting requirements on the optoelectronic and electronic components used at the transmitting and receiving ends. The data transfer rate is limited by, inter alia, unwanted capacitances at the transmitting and receiving ends and by long connecting paths between drive electronics and optoelectronic component. One way of reducing the influence of unwanted capacitances and long connecting paths is to combine the optoelectronic component, e.g., a laser diode or a detector, and the associated electronics into a monolithic integrated circuit on a semiconductor substrate. The fabrication of such modules requires a number of process steps, such as deposition of various semiconductor layers, passivation, and electric isolation of the individual electronic and optoelectronic components. Certain epitaxial processes result in nonplanar wafer surfaces. On such surfaces, it is difficult to form micropatterns using photolithographic techniques.

SUMMARY OF THE INVENTION

It is the object of the invention to provide a low-cost method of making integrated optoelectronic modules in few steps which permits the use of microlithographic patterning processes and which provides reliable electric isolation between the individual components.

The above object is generally achieved according to the present invention by a method for producing monolithic integrated modules, particularly optoelectronic modules, which contain first and second components wherein after a first set of components have been formed in a known manner on a substrate, a semi-insulating (SI) indium-phosphide layer is selectively deposited by an epitaxial process. After patterning and etching steps, a succession of semiconductor layers is epitaxially deposited on the semi-insulating indium-phosphide layer for forming a second set of components.

The method according to the invention has the advantage that the selective deposition of epitaxial layers results in planar wafer surfaces, which simplify the control of the micropatterning process. Another advantage lies in the use of semi-insulating indium-phosphide material, whereby, on the one hand, good passivation of the individual components and, on the other hand, good electric isolation between the components are achieved. A further advantage of the invention results if an n-InP-doped substrate material is used instead of a semi-insulating substrate. The epitaxial layers deposited on such a substrate have a better crystal quality than those deposited on a semi-insulating indium-phosphide substrate. Electric isolation between the optoelectronic components and the electronic circuitry is provided by epitaxially deposited semi-insulating indium phosphide. A still further advantage of the method according to the invention lies in the high flexibility in conceptualizing the design of the monolithic integrated circuit.

BRIEF DESCRIPTION OF THE DRAWINGS

An example of how the method is applied will now be explained in greater detail with reference to the accompanying drawings, in which.

DETAILED DESCRIPTION OF THE PREFERRED EMBODIMENTS

Figure 1:
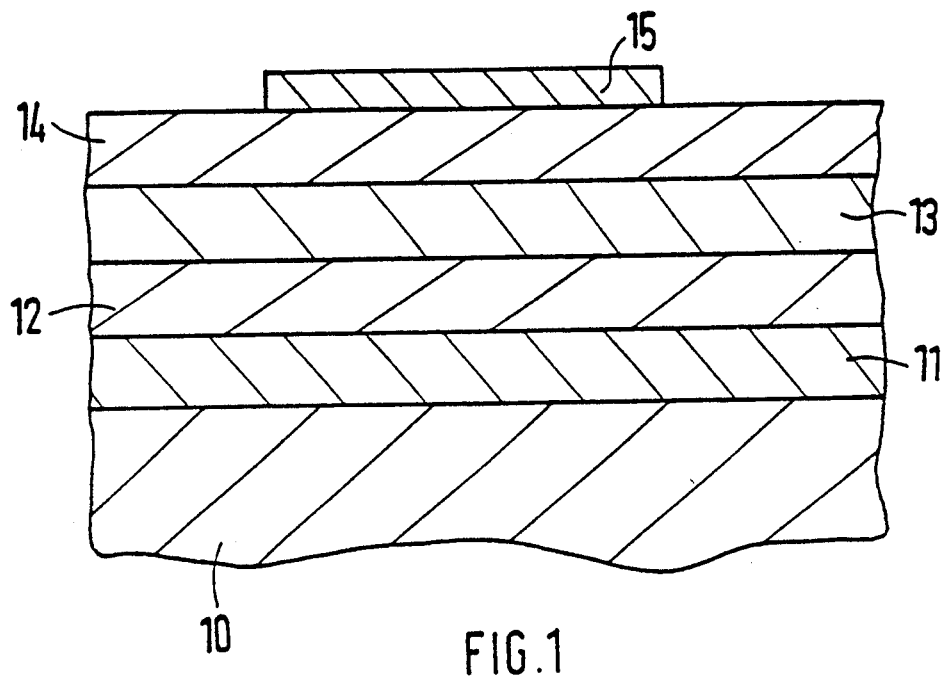
FIG. 1 shows a cross-section of a first succession of layers on a semiconductor substrate or on n-type indium phosphide.

FIG. 1 shows a part of a semiconductor wafer. A succession of different semiconductor layers has been epitaxially grown on a semiconductor substrate 10 preferably semi-insulating InP. The reference numeral 11 denotes an n-type InP layer, 12 an InGaAsP layer serving as an active layer, 13 a p-type InP layer, and 14 a p-type InGaAs layer. A dielectric etch mask of, e.g., silicon dioxide is designated 15. It covers the succession of layers. Below the etch mask 15, an optoelectronic component is to be formed. The various semiconductor layers were deposited by either metal-organic vapor phase epitaxy (MOVPE), liquid-phase epitaxy (LPE) or molecular beam epitaxy (MBE). Instead of the semiconductor substrate 10, an n-type InP substrate can be used. The reason for this will be given later.

Figure 2:
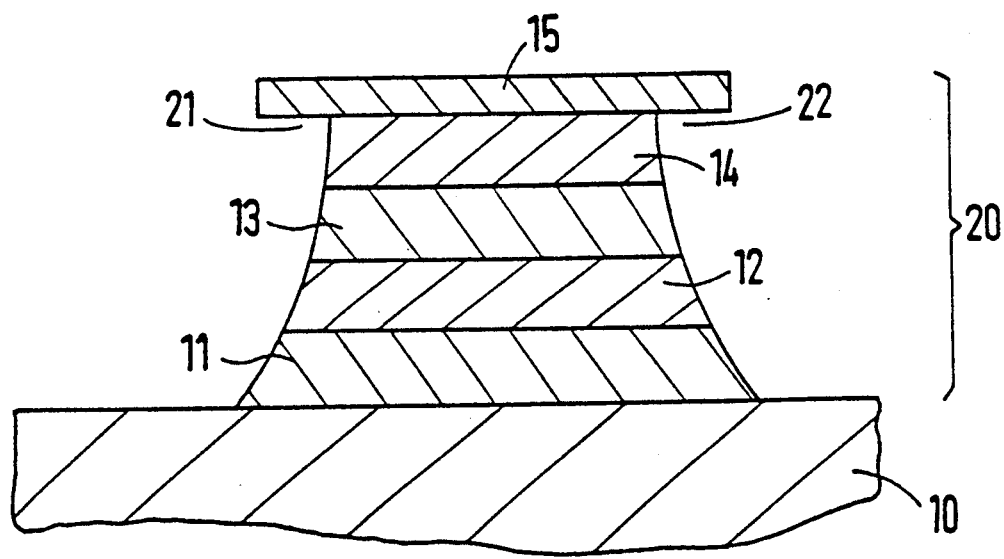
FIG. 2 shows a cross-section of the etched layer structure of FIG. 1 with a dielectric etch mask.

The portions of the semiconductor layers which are not covered by the etch mask 15 are etched away by suitable etchants. A mesa-shaped layer structure as shown in FIG. 2 is obtained. The individual semiconductor layers 11 through 14 can be recognized. Portions of the dielectric mask which overhang the semiconductor material are designated 21 and 22. Through these overhangs, enhanced growth at edges during the subsequent epitaxial deposition of other semiconductor layers is avoided. This results in extremely flat wafer surfaces as are necessary for forming micropatterns by lithography.

Figure 3:
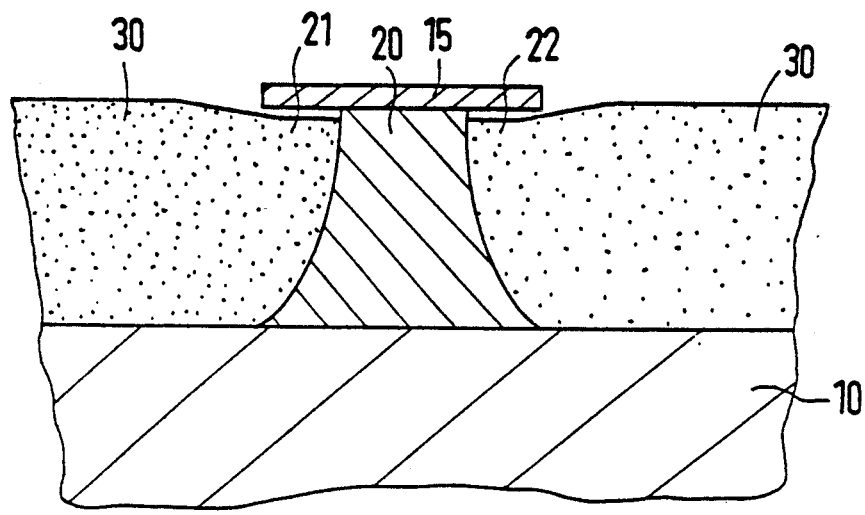
FIG. 3 shows a cross-section of the selective epitaxy of semi-insulating semiconductor material.
Figure 4:
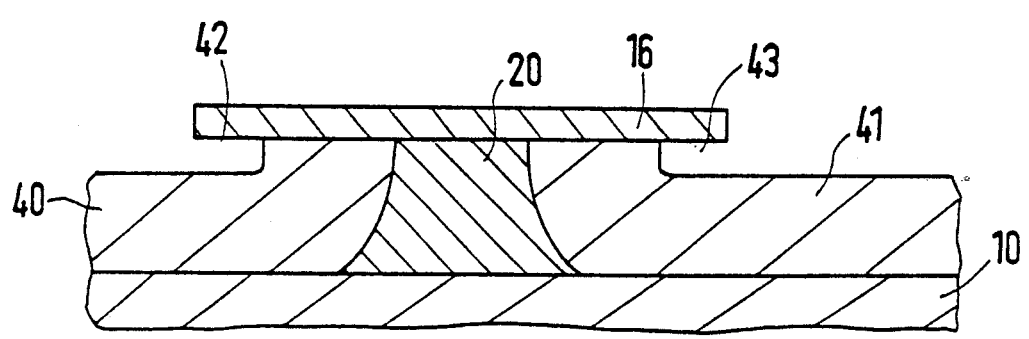
FIG. 4 shows a cross-section of an optoelectronic component, the semi-insulating semiconductor material, and a second etch mask.

In FIGS. 2 to 6, the mesa-shaped layer structure is labelled 20. This mesa-shaped layer structure 20 is covered by the etch mask 15 as seen in FIG. 3. It is surrounded by regions 30 of semi-insulating InP. The InP layer 30 is deposited by any epitaxial process, such as vapor-phase epitaxy, liquid-phase epitaxy or molecular beam epitaxy. At the overhangs 21 and 22, no enhanced growth has occurred. The semi-insulating semiconductor material 30 serves to passivate the optoelectronic component 20 and is to isolate the optoelectronic component from electronic circuitry to be deposited later. For this reason, the succession of layers 20 must be surrounded by semi-insulating InP material. To this end, the dielectric etch mask 15 is replaced by a somewhat wider mask 16, and the entire wafer is subsequently etched. The result of the etching process is illustrated in FIG. 4. The succession of layers 20 is surrounded by semi-insulating InP. The InP stripes are designated 40 and 41. 42 and 43 denote overhangs of the dielectric etch mask. By selective epitaxy, further semiconductor layers, which are necessary to form electronic components, are deposited on the structure of FIG. 4. The overhangs 42 and 43 ensure that no enhanced growth occurs at the edges. The kind of semiconductor layers deposited depends on what electronic components are desired.

Figure 5:
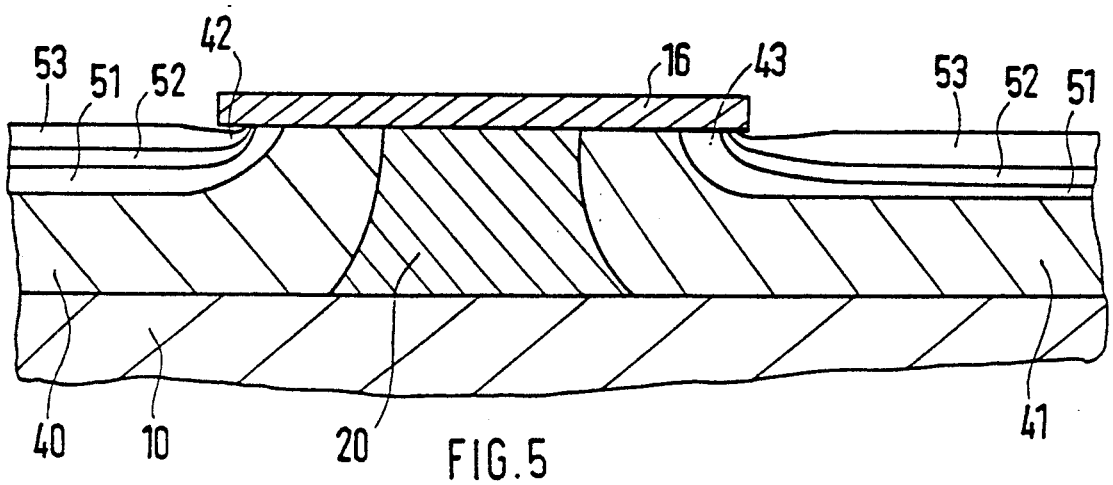
FIG. 5 shows a cross-section of the succession of layers deposited by selective epitaxy for forming electronic components.

FIG. 5 shows a layer structure for a hetero-bipolar transistor consisting of an n-type layer 51, a p-type layer 52, and an n-type layer 53. Other layer structures, e.g., structures as are necessary for field-effect transistors, are possible. The stripes 40 and 41 of semi-insulating InP serve, on the one hand, to passivate the succession of layers 20, i.e., the optoelectronic component, and, on the other hand, to provide electric isolation between the optoelectronic component and the electronic component. Thus, the substrate 10 does not serve to electrically isolate the individual components from each other. For this reason, an n-type InP substrate can be used instead of a semi-insulating substrate. The use of an n-type InP substrate has the advantage that the semiconductor layers deposited on it have a better crystal structure than those deposited on a semi-insulating substrate.

Figure 6:
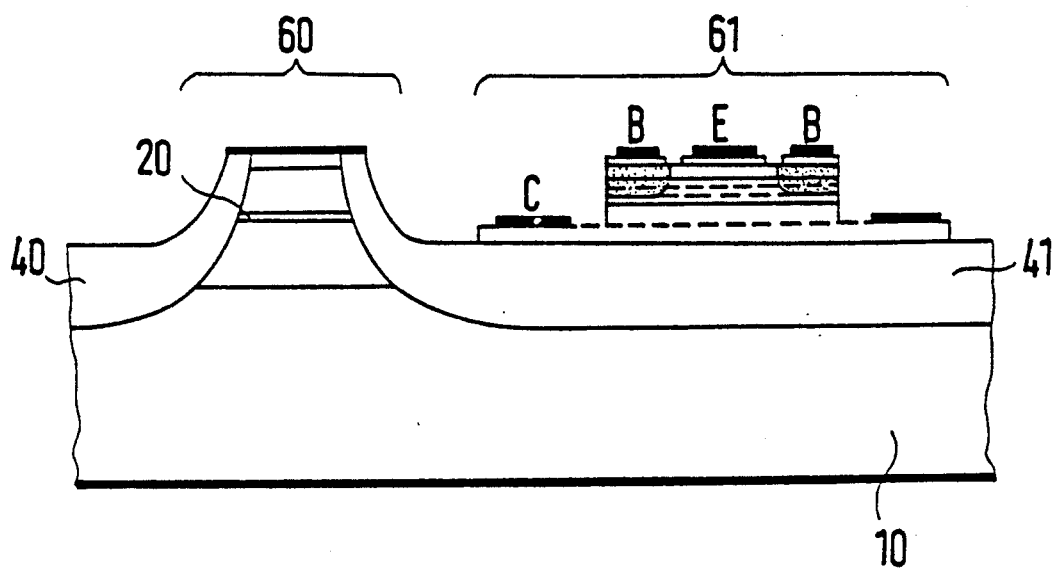
FIG. 6 shows a cross-section of a hetero-bipolar transistor on the semi-insulating substrate material.

FIG. 6 shows a finished optoelectronic module. The reference numeral 60 denotes a region containing the optoelectronic component, either a laser diode or a detector. This region 60 is surrounded by the semi-insulating InP layers 40 and 41. On the stripe 41, a semiconductor structure 61 is deposited which represents an electronic component. The region 60 representing a laser 60 the semiconductor structure 61 representing an electronic component 61 are electrically isolated from each other by the semi-insulating material 41.

The fabrication of the electronic components is not described here in detail since it does not form part of the invention. The individual processes are familiar to those skilled in the art.

What is claimed is:

1. Method of producing monolithic integrated optoelectronic modules, containing at least first and second components, comprising the steps of forming the first components on a portion of a semiconductor substrate surface, selectively depositing a semi-insulating indium-phosphide layer by an epitaxial process on said substrate surface, masking at least said first components, partially etching the indium-phosphide layer, and epitaxially depositing a succession of layers on said semi-insulating indium-phosphide layer for forming the second components.

2. A method as claimed in claim 1, wherein the first components are double-heterostructure lasers.

3. A method as claimed in claim 1, wherein the first components are PIN photodiodes.

4. A method as claimed in claim 1, wherein the second components are hetero-bipolar transistors.

5. A method as claimed in claim 1, wherein the second components are field-effect transistors.

6. A method as claimed in claim 1, wherein the first components are light responsive components.

7. A method as claimed in claim 1, wherein the first and second components are III/V compound semiconductor material.

8. A method of producing monolithic integrated optoelectronic modules, containing at least first and second components, comprising the following steps:
    a) epitaxially depositing a first succession of layers over a surface of a substrate;
    b) covering a portion of the first succession of layers with a first dielectric layer leaving an uncovered portion;
    c) etching away the uncovered portion of the first succession of layers to leave a layered structure constituting a first component under the first dielectric layer;
    d) selectively epitaxially depositing a semi-insulating InP layer, with the first dielectric layer acting as a mask, until the InP layer and the layered structure form a flat surface;
    e) replacing the first dielectric layer with a second dielectric layer which substantially extends laterally beyond said layered structure on all sides leaving an uncovered portion of the InP layer;
    f) partially etching away the uncovered portion of the semi-insulating InP layer;
    g) selectively epitaxially depositing a second succession of layers for forming the second components on the surface of the etched InP layer; and
    h) forming the second components in the second succession of layers by lithographic and etching processes.

9. A method as claimed in claim 8, wherein the first succession of layers is formed by one of
    vapor-phase epitaxy (VPE),
    liquid-phase epitaxy (LPE), and
    molecular beam epitaxy (MBE).

10. A method as claimed in claim 8, wherein the semi-insulating InP layer is formed by one of
    vapor-phase epitaxy,
    liquid-phase epitaxy, and
    molecular beam epitaxy.

11. A method as defined in claim 8, wherein the substrate is a semiinsulating substrate.

12. A method as defined in claim 11, wherein the semiinsulating substrate is a semiinsulating InP substrate.

13. A method as defined in claim 8, wherein the substrate is a conducting InP substrate.

14. A method as defined in claim 13, wherein the InP substrate is a n-type conducting InP substrate.

15. A method as claimed in claim 8, wherein the first components are light responsive components.

16. A method as claimed in claim 8, wherein the first and second succession of layers are made of III/V compound semiconductor material.

* * * * *